United States Patent
Haesters et al.

(10) Patent No.: US 7,589,490 B2
(45) Date of Patent: Sep. 15, 2009

(54) MOTOR CONTROL SYSTEM FOR THE PWM CONTROL OF AN ELECTRIC MOTOR

(75) Inventors: Achim Haesters, Pulheim (DE); Bernd Dienhart, Köln (DE); Joachim Waschkies, Kürten (DE); Guido Lindeke, Bergisch Gladbach (DE); Cornelius Peter, Buehl (DE); Angelika Peter, legal representative, Buehl (DE)

(73) Assignee: Ford Motor Company, Dearborn, MI (US)

( * ) Notice: Subject to any disclaimer, the term of this patent is extended or adjusted under 35 U.S.C. 154(b) by 273 days.

(21) Appl. No.: 11/820,271

(22) Filed: Jun. 19, 2007

(65) Prior Publication Data

US 2008/0008459 A1 Jan. 10, 2008

(30) Foreign Application Priority Data

Jun. 23, 2006 (DE) .................. 10 2006 029 332

(51) Int. Cl.
*H02P 23/00* (2006.01)

(52) U.S. Cl. .................. 318/811; 318/471; 318/472; 318/565

(58) Field of Classification Search ................. 318/471, 318/472, 432, 434, 565, 451, 700, 807, 811; 388/800, 811, 819, 909, 934
See application file for complete search history.

(56) References Cited

U.S. PATENT DOCUMENTS

| | | | |
|---|---|---|---|
| 4,856,078 A * | 8/1989 | Konopka ............ | 388/831 |
| 5,142,433 A | 8/1992 | Nishibe et al. | |
| 5,349,275 A * | 9/1994 | Muller ............ | 318/400.29 |
| 5,625,518 A | 4/1997 | Bober | |
| 6,321,031 B1 | 11/2001 | Mohr et al. | |
| 6,577,482 B1 | 6/2003 | Eisenhardt et al. | |
| 6,963,183 B1 * | 11/2005 | Kessler et al. ............ | 318/434 |
| 7,038,415 B2 * | 5/2006 | Nakamura et al. ............ | 318/471 |
| 7,193,382 B2 * | 3/2007 | Jeon ............ | 318/434 |
| 7,271,559 B2 * | 9/2007 | Peter et al. ............ | 318/400.08 |
| 7,394,215 B2 * | 7/2008 | Tsai et al. ............ | 318/461 |
| 2006/0033459 A1 | 2/2006 | Peter et al. | |

FOREIGN PATENT DOCUMENTS

DE 39 24 499 7/1989

(Continued)

*Primary Examiner*—Bentsu Ro
*Assistant Examiner*—Thai Dinh
(74) *Attorney, Agent, or Firm*—Frank K. MacKenzie; MacMillan, Sobanski & Todd LLC

(57) ABSTRACT

The subject of the present invention is a motor control system having a monitoring circuit for monitoring PWM control for a DC electric motor, the PWM control comprising a power end stage having at least one field effect transistor, which controls the current at the DC electric motor. The motor control system is designed to monitor the current at the DC electric motor. The motor control system detects the voltage drop across the field effect transistor and comprises a temperature sensor for detecting the temperature of the field effect transistor. Furthermore, the motor control system is designed to determine the resistance of the field effect transistor from the detected temperature thereof, and to determine the current at the DC electric motor from the resistance of the field effect transistor and from the voltage drop across the field effect transistor.

19 Claims, 8 Drawing Sheets

FOREIGN PATENT DOCUMENTS

| | | |
|---|---|---|
| DE | 40 00 637 | 1/1990 |
| DE | 197 32 094 | 7/1997 |
| DE | 197 32 098 | 7/1997 |
| DE | 198 17 792 | 4/1998 |
| DE | 199 41 489 | 9/1999 |
| DE | 100 02 875 | 1/2000 |
| DE | 102 32 716 | 7/2002 |
| DE | 102 59 732 | 12/2002 |
| DE | 10 2004 039 392 | 8/2004 |

\* cited by examiner

MOTOR CONTROL SYSTEM FOR THE PWM CONTROL OF AN ELECTRIC MOTOR

CROSS REFERENCE TO RELATED APPLICATION

This application is based on, claims the benefit of and incorporates herein by reference German patent application no. DE 10 2006 029 332.0, filed Jun. 23, 2006.

BACKGROUND OF THE INVENTION

The present invention relates generally to a motor control system for monitoring pulse width-modulated (PWM) control for a direct current (DC) electric motor, in particular for a fan motor for use in the motor vehicle sector.

German patent application DE 1 941 489 A1 has disclosed a protective circuit for a series circuit comprising a power semiconductor end stage and an inductive load, in parallel with which a freewheeling circuit comprising a freewheeling diode and a series-connected polarity reversal protection semiconductor switch is connected. The power semiconductor end stage can be switched on and off again as a function of a predetermined desired value with a pulse width-modulated control signal. The polarity reversal protection semiconductor switch can be controlled via a charge pump 36 such that it is not conductive when the polarity of the supply voltage has been reversed. As is further described in the mentioned laid-open specification, such protective circuits in the case of fault-free components provide sufficient polarity reversal protection, i.e. protection of the components against overload and destruction in the case of a supply voltage which is applied with the polarity reversed. However, if irregularities occur in such a circuit, uncontrolled overvoltages may occur in the circuit which can lead to destruction of components.

Accordingly, German patent application DE 199 41 489 A1 proposes developing the abovementioned protective circuit such that a point in the freewheeling circuit is monitored for a voltage which occurs when the freewheeling circuit is not functioning. Alternatively, it is proposed to monitor a point in the freewheeling circuit for a current which fails when the freewheeling circuit is not functioning. In the case of the occurrence of the fault voltage or in the case of failure of the current at the monitored point, the shutdown of the driving for the power semiconductor end stage will then be introduced. In particular, DE 199 41 489 A1 proposes monitoring the voltage drop across a field effect transistor (FET) arranged in the freewheeling circuit by means of a specially designed monitoring circuit. For this purpose, a buffer capacitor is connected in the freewheeling circuit at the connection point between the freewheeling diode and the polarity reversal protection semiconductor switch. The voltage at this buffer capacitor is then used as a monitoring voltage and is supplied to the motor electronics via a voltage divider.

One disadvantage with the protective circuit known from DE 199 41 489 A1 is the comparatively large number of cost-intensive components which are required for the protective circuit. Furthermore, the protective circuit requires continuous operation of the driven electric motor during pulse width-modulated operation in order for it to function properly. Operation at a duty cycle of 100% is not possible. This results in disadvantages in terms of the efficiency of the motor control system.

SUMMARY OF THE INVENTION

An object of an embodiment of the present invention is to specify a motor control system for monitoring pulse width-modulated control for a DC electric motor, the intention being for the motor control system to be designed to monitor the current at the DC electric motor, and for the motor control system at the same time to avoid the disadvantages of the protective circuits previously known from the prior art.

Furthermore, an object of an embodiment of the present invention is to specify a method for monitoring pulse width-modulated control for a DC electric motor by means of a motor control system, the intention being for the motor control system to be designed to monitor the current at the DC electric motor. Here, the pulse width-modulated control will comprise a power end stage having at least one field effect transistor, which controls the current at the DC electric motor.

A motor control system according to the invention for monitoring pulse width-modulated control for a DC electric motor is in this case designed to detect the voltage drop across the current-controlling field effect transistor. This voltage drop is linked directly with the current at the DC electric motor via the internal resistance of the field effect transistor and Ohm's Law. Furthermore, the motor control system comprises a temperature sensor, which is designed to detect the temperature of the current-controlling field effect transistor of the power end stage. Furthermore, the motor control system is designed to determine the resistance of the current-controlling field effect transistor from the temperature thereof detected by means of the temperature sensor. The current across the DC motor is then determined from the resistance of the field effect transistor and from the detected voltage drop across the field effect transistor.

A motor control system according to the invention has markedly improved accuracy in comparison with the monitoring circuits previously known from the prior art, at the same time it being possible for the number of components required to be substantially reduced. The temperature-dependent internal resistance of the current-controlling field effect transistor can in this case be tabulated in a very simple manner, the characteristic of the field effect transistor being subject to virtually no ageing phenomena. Finally, the motor control system according to an embodiment of the invention has the advantage that it is capable of functioning in all operating states of the pulse width-modulated control—in particular even at a duty cycle of 100%.

In one preferred embodiment, the motor control system according to the invention is designed to compare the determined current at the DC electric motor with a predetermined reference value. This predetermined reference value can, in this case in particular, be a function of the duty cycle of the pulse width-modulated control. The motor control system according to the invention can, in particular, be designed to remove the pulse width-modulated control from operation if the determined current at the DC electric motor exceeds the predetermined reference value—in particular when exceeding it by a prescribed amount.

BRIEF DESCRIPTION OF THE DRAWINGS

Advantages and features of the motor control system according to the invention are given in the exemplary embodiments discussed below, which will be explained in more detail with reference to the drawing, in which.

DETAILED DESCRIPTION

Figure 1:
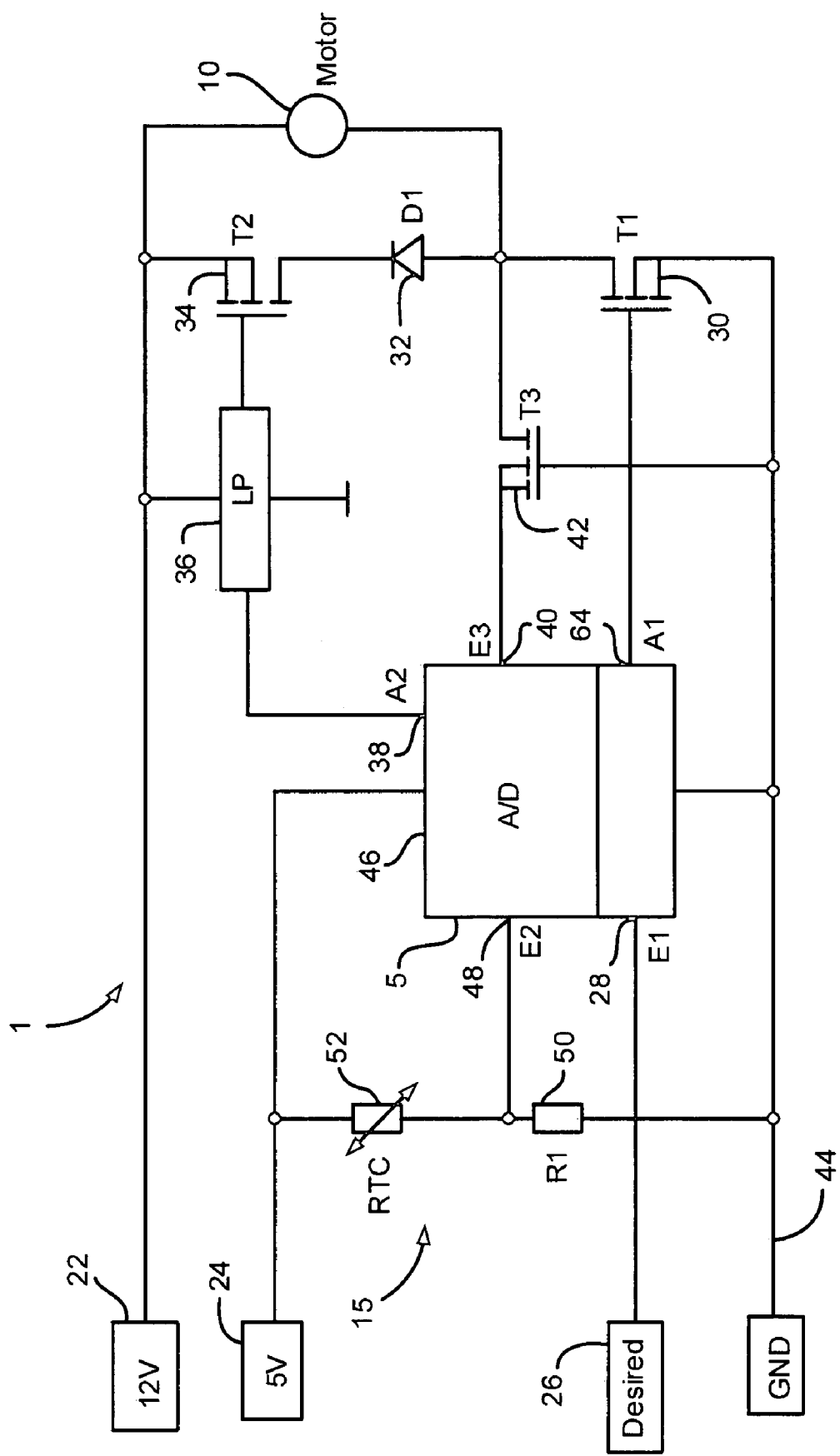
FIG. 1 shows a basic circuit diagram of a first embodiment of a motor control system.

FIG. 1 shows a circuit diagram of a pulse width-modulated (PWM) control system 1 for a direct current (DC) electric motor 10, which comprises a circuit arrangement for monitoring the motor current. The control system 1 is intended to be connected to the 12 volt power supply system 22 of a motor vehicle, it being possible for other supply voltages to be used given a suitable design of the control system 1. The control system 1 comprises a microprocessor 5, which is supplied with a supply voltage of 5 volts, which is produced, for example, by a voltage regulator 24. The microprocessor 5 is intended to receive a desired signal at its input (E1) 28 from a control device 26, which signal predetermines the desired rotation speed of the motor 10 to be driven. On the basis of the desired signal present at the input 28, the microprocessor 5 produces control signals for a power field effect transistor (T1) 30, which is connected in series with the motor 10 to be driven. In order to minimize electromagnetic interference pulses from the motor 10, the motor control system 1 has a freewheeling circuit comprising a freewheeling diode (D1) 32 and a field effect transistor (T2) 34, which is connected in series with the freewheeling diode 32. The field effect transistor 34, which is arranged in the freewheeling circuit, functions in a manner known per se as polarity reversal protection for the motor control system 1. For this purpose, the gate of the field effect transistor 34 is driven by a charge pump (LP) 36, such that, given the correct polarity of the supply voltage at the control system 1, the source-drain path of the field effect transistor 34 is switched to be conductive. If, on the other hand, the polarity of the supply voltage has been reversed, the charge pump 36 does not apply any voltage to the gate of the field effect transistor 34. This field effect transistor is in the off state, with the result that no current can flow via the freewheeling diode 32, which is connected in the forward direction in the case of polarity reversal, as a result of which it is protected from damage.

The charge pump 36 is connected to the output (A2) 38 of the microprocessor 5 and is driven by it such that the charge pump 36 can supply the required control voltage to the gate of the field effect transistor 34 in the operation-ready state of the pulse width-modulated motor control system 1.

According to the invention, the current flowing via the DC electric motor 10 is now monitored. For this purpose, provision is made to measure the voltage drop across the power field effect transistor 30 in a suitable manner. For this purpose, the node point between the anode of the freewheeling diode 32 and the field effect transistor 30 is connected to the input (E3) 40 of the microprocessor 5 via a control line.

The source-drain path of a depletion field effect transistor (T3) 42 is inserted between the field effect transistor 30 and the input 40 of the microprocessor 5. The gate of this field effect transistor is connected to the ground rail 44. The depletion field effect transistor 42 serves the purpose of protecting the input 40 of the microprocessor 5 against excessively high input voltages. It is selected such that its source-drain path is conductive only up to a maximum source voltage of approximately 2 V; at higher voltages the source-drain path is off. As a result, the input 40 of the microprocessor 5 is effectively protected against excessively high input voltages, which could result, for example, owing to induction phenomena at the freewheeling electric motor 10.

The input 40 is connected to the input of an analog-to-digital converter 46, which is integrated in the microprocessor 5, digitizes the voltage signal present at the input 40, which signal represents the voltage drop across the source-drain path of the power field effect transistor 30, and makes it available for further processor-internal processing.

The microprocessor 5 has the further input (E2) 48 from a temperature sensor 15, with the input 48 connected to an integrated analog-to-digital converter 46. The voltage signal of a voltage divider, which is formed from a nonreactive resistor (R1) 50 and a temperature-variable resistor (RTC) 52, for example a negative temperature coefficient (NTC) thermistor, is present at the input 48. The temperature-variable resistor 52 is, in this case, arranged within the circuit arrangement such that it is in direct contact with the power field effect transistor 30. In particular, the temperature-variable resistor 52 can be arranged on the housing of the power field effect transistor 30, with the result that a change in temperature of the power field effect transistor 30 is directly dependent on a change in resistance of the temperature-dependent resistor 52.

The voltage present at the input 48 of the microprocessor 5 is therefore a measure of the temperature of the power field effect transistor 30. The temperature dependence of the internal resistance of the power field effect transistor 30 is in this case a characteristic variable for the field effect transistor 30 and is subject to virtually no changes, for example owing to ageing.

A first reference table of the temperature-dependent resistor of the field effect transistor 30 is stored in the microprocessor 5 or a memory, which is associated with the microprocessor 5 (not illustrated separately herein). Furthermore, a second reference table is stored in the microprocessor 5 or a memory associated with it (not illustrated separately herein), in which reference table the resistance of the temperature-dependent resistor 52 is recorded as a function of the temperature. The temperature of the temperature-dependent resistor 52 and therefore also of the power field effect transistor 30 can be determined, on the basis of this second reference table, from the digitized voltage signal at the input 48. The internal resistance of the source-drain path of the field effect transistor 30 can now be determined, using the measured temperature, from the first reference table.

A particularly high degree of accuracy of the monitoring circuit according to the invention results if the first reference table, in which the temperature-dependent resistance of the source-drain path of the power field effect transistor 30 is tabulated at different currents, is set up individually once an operation-ready circuit according to the invention has been completed, in the context of an "end-of-line" calibration of the installed field effect transistor 30.

Overall, the current, which flows via the source-drain path of the field effect transistor 30, can therefore be determined on the basis of the established temperature of the power field effect transistor 30 and its internal resistance, which can be determined via the temperature measurement, from the voltage drop across the source-drain path of the power field effect transistor 30, which is present at the input 40 of the microprocessor 5, using Ohm's Law. Owing to the series circuit comprising the field effect transistor 30 and the motor 10 to be monitored, this corresponds to the motor current.

Figure 7:
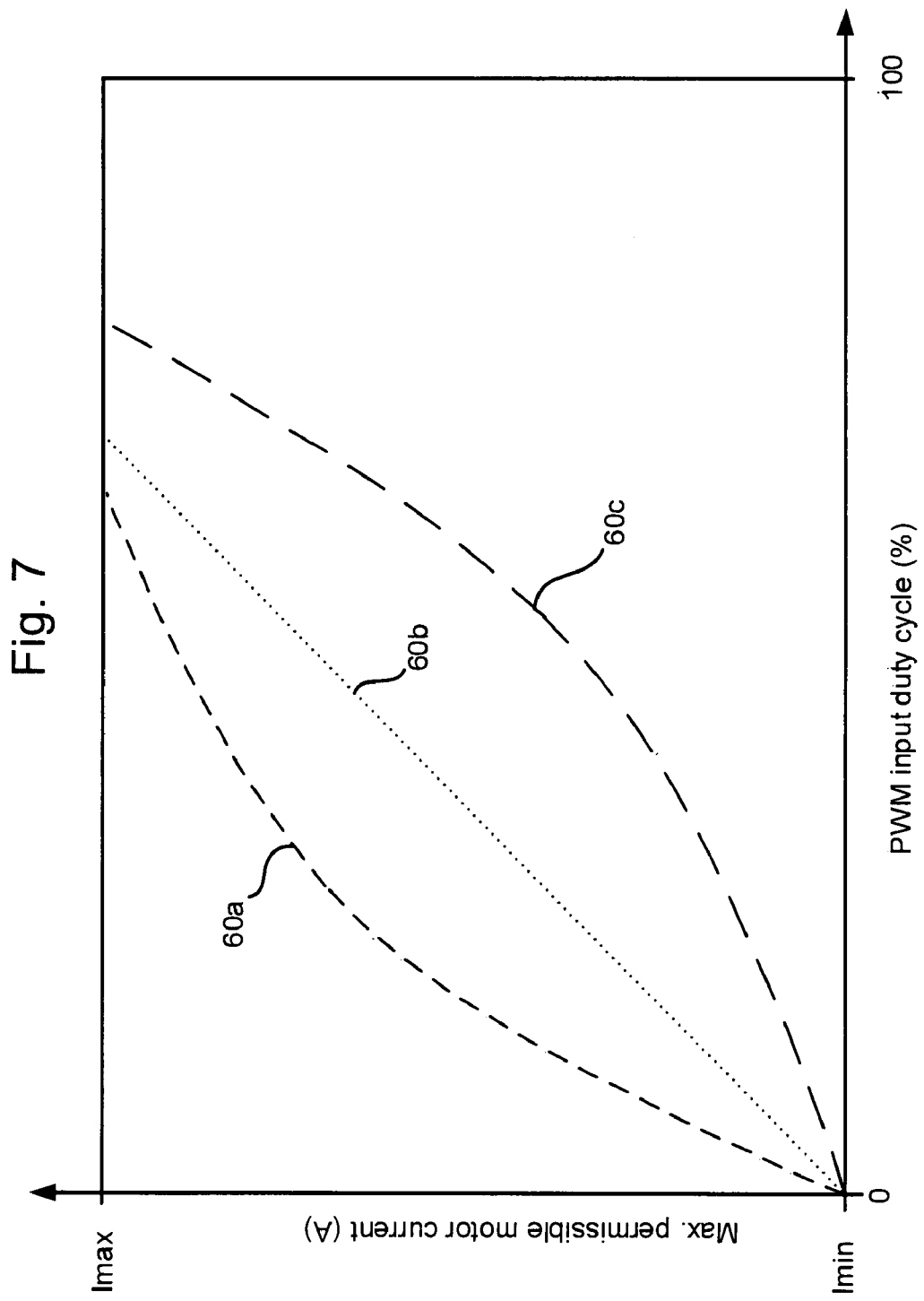
FIG. 7 shows a schematic illustration of a profile of a maximum permissible motor current at a DC electric motor driven by a pulse width-modulated motor control system, according to the invention, as a function of the duty cycle of the pulse width-modulated control.

In a third reference table, which is likewise stored in the microprocessor 5 or a memory associated with it (not illustrated separately herein), the rated values for the motor current as a function of the duty cycle of the pulse width-modulated motor control system are tabulated. By way of example, various profiles 60a, 60b, 60c for the motor current as a function of the duty cycle are illustrated in FIG. 7. The microprocessor 5 is now designed to compare the motor current, which is determined by means of the above-described method, with the motor current recorded in the third reference table for the currently used duty cycle. If the measured motor current exceeds the motor current given in the third reference table by a preset amount, the microprocessor 5 introduces the shutdown of the motor 10, for example by the output (A1) 64, via which the power field effect transistor 30 is driven, being brought out of operation.

Figure 2:
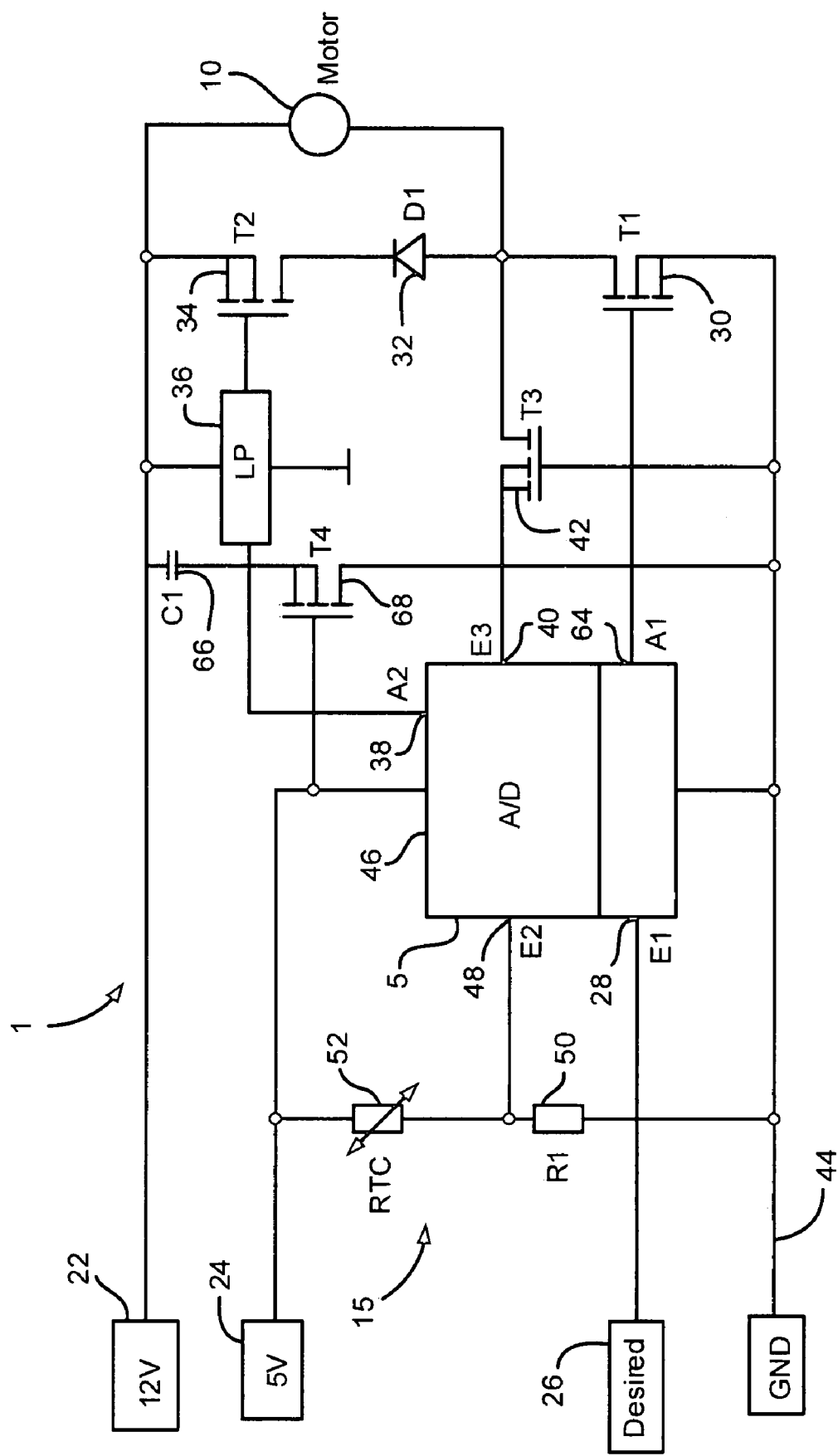
FIG. 2 shows a second embodiment of the circuit diagram of FIG. 1.

In order to electromagnetically decouple the electric motor 10 from the 12 volt power supply system 22 of the motor vehicle, an electrolyte capacitor (C1) 66 can be connected in parallel with the electric motor 10, as can be seen in the embodiment of FIG. 2. The arrangement described in FIG. 2 has many elements in common with that of FIG. 1, and to avoid unnecessary repetition of the description the same reference numbers have been used for common elements. This electrolyte capacitor 66 is sensitive to polarity reversal and is therefore protected from polarity reversal via a third field effect transistor (T4) 68, whose source-drain path is connected in series with the electrolyte capacitor 66. The gate of the field effect transistor 68 is driven via the 5 volt rail, with the result that the field effect transistor 68 is conductive as long as the 5 volt supply voltage is present at its gate. Effective polarity reversal protection for the electrolyte capacitor 66 is therefore achieved if suitable technical measures are used to ensure that the 5 volt supply voltage is safely disconnected if the 12 volt vehicle voltage is applied to the motor control system 1 with the polarity reversed. This can be realized, for example, by suitably connecting the voltage regulator 24, which generates the 5 volt supply voltage for the motor control system 1 and is supplied from the 12 volt vehicle power supply system 22, in a parallel circuit with the motor control system 1.

Figure 3:
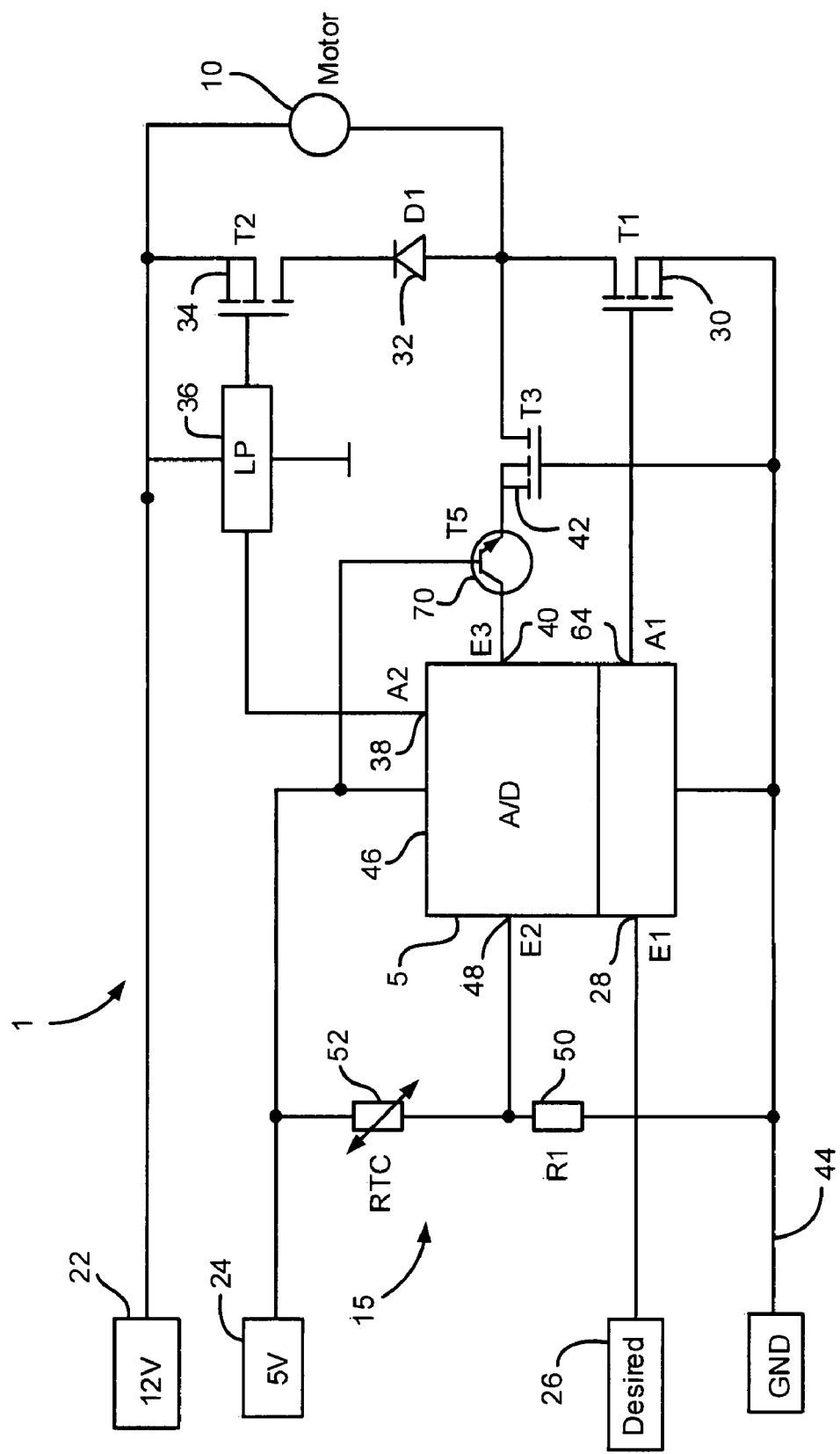
FIG. 3 shows a third embodiment of the circuit diagram of FIG. 1.

FIG. 3 shows a third embodiment of the motor control system 1 from FIG. 1. The arrangement described in FIG. 3 has many elements in common with that of FIG. 1, and to avoid unnecessary repetition of the description the same reference numbers have been used for common elements. Here, a collector-emitter path of a bipolar transistor (T5) 70 is arranged in the measuring line between the input 40 of the microprocessor 5 and the node between the power field effect transistor 30 and the anode of the freewheeling diode 32. The base of the bipolar transistor 70 is in this case connected to the positive terminal of the 5 volt rail via suitable resistors (not shown). The bipolar transistor 70 is used to minimize leakage currents via the microprocessor 5 in the off state of the motor control system shown, which leakage currents may be the cause of increased quiescent currents. Possible sources of such leakage currents may be, for example, electrolyte capacitors having a high capacitance which are connected in parallel with the driven DC electric motor 10.

Figure 4:
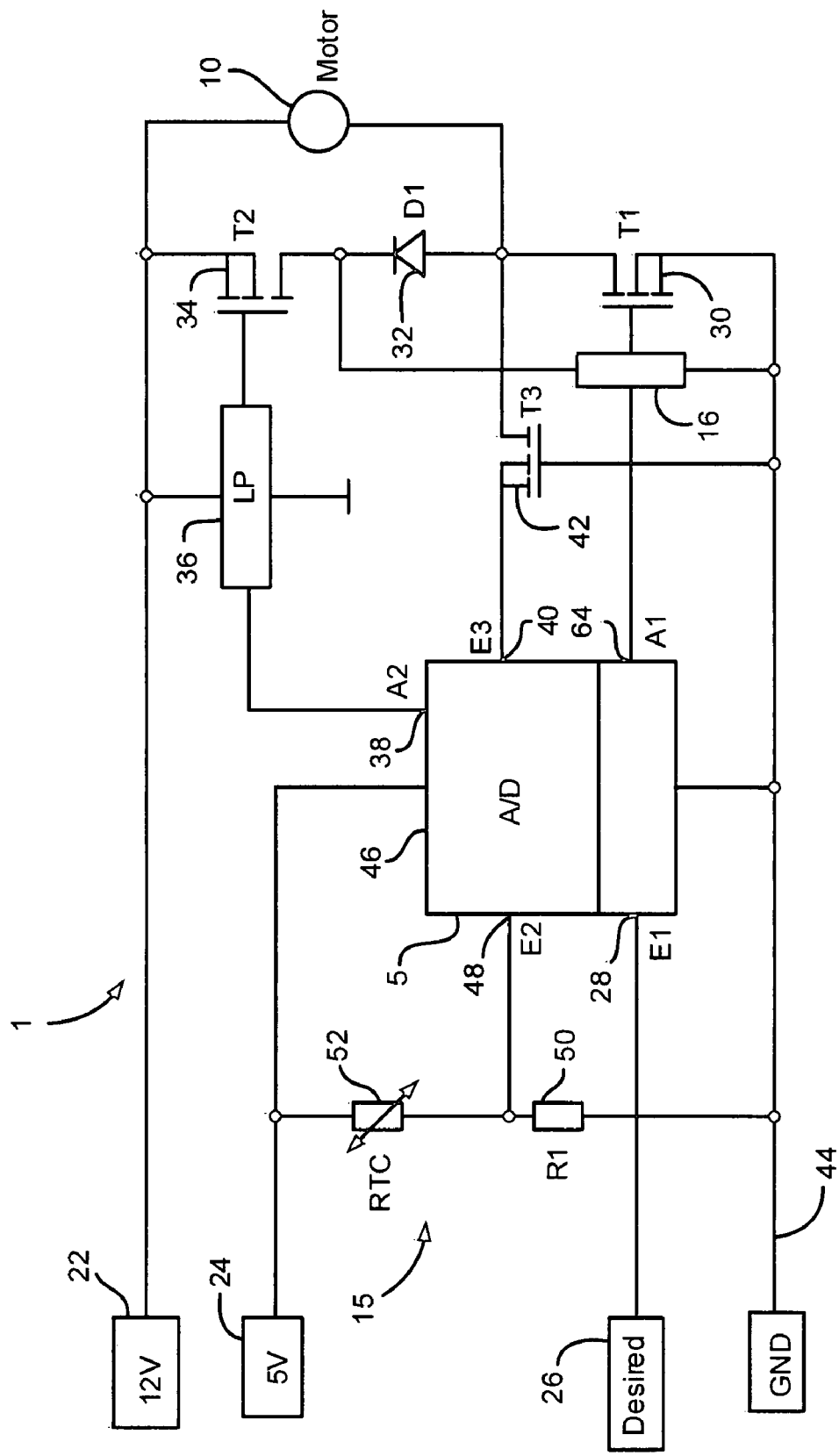
FIG. 4 shows a fourth embodiment of the circuit diagram of FIG. 1.

FIG. 4 shows a fourth embodiment of the motor control system 1 shown in FIG. 1, having a power amplifier stage 16 being arranged in the control line, which extends between the output 64 of the microprocessor 5 and the gate of the field effect transistor 30. The arrangement described in FIG. 4 has many elements in common with that of FIG. 1, and to avoid unnecessary repetition of the description the same reference numbers have been used for common elements. This power amplifier stage 16 is likewise supplied from the 12 volt power supply system 22 of the motor vehicle, the voltage tap being connected on the high side at the node point between the drain terminal of the field effect transistor 34 and the cathode of the freewheeling diode 32. In this manner, the amplifier stage 16 is also reliably protected from polarity reversal of the 12 volt supply voltage by the polarity reversal protection circuit integrated in the freewheeling circuit. The amplifier stage 16 can in this case be constructed using suitable bipolar transistors, for example. The amplifier stage 16 primarily serves the purpose of realizing short switching times for the field effect transistor 30 despite the internal capacitance of the gate electrode of the power field effect transistor 30, with the result that operation at the desired clock cycle numbers of between 10 and 30 kHz, in this case in particular 20 to 25 kHz, is possible without any problems.

Figure 5:
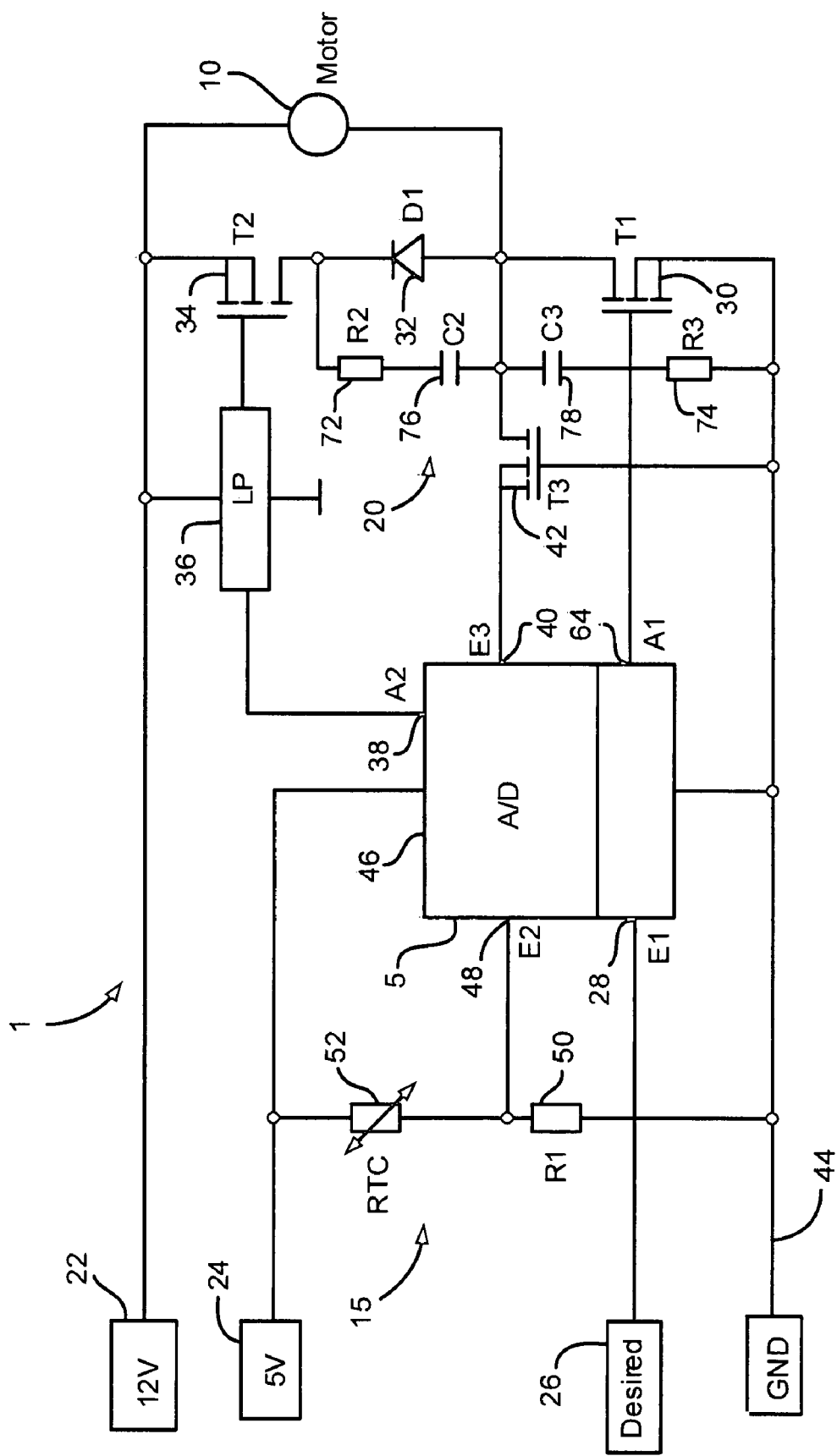
FIG. 5 shows a fifth embodiment of the circuit diagram of FIG. 1.
Figure 8:
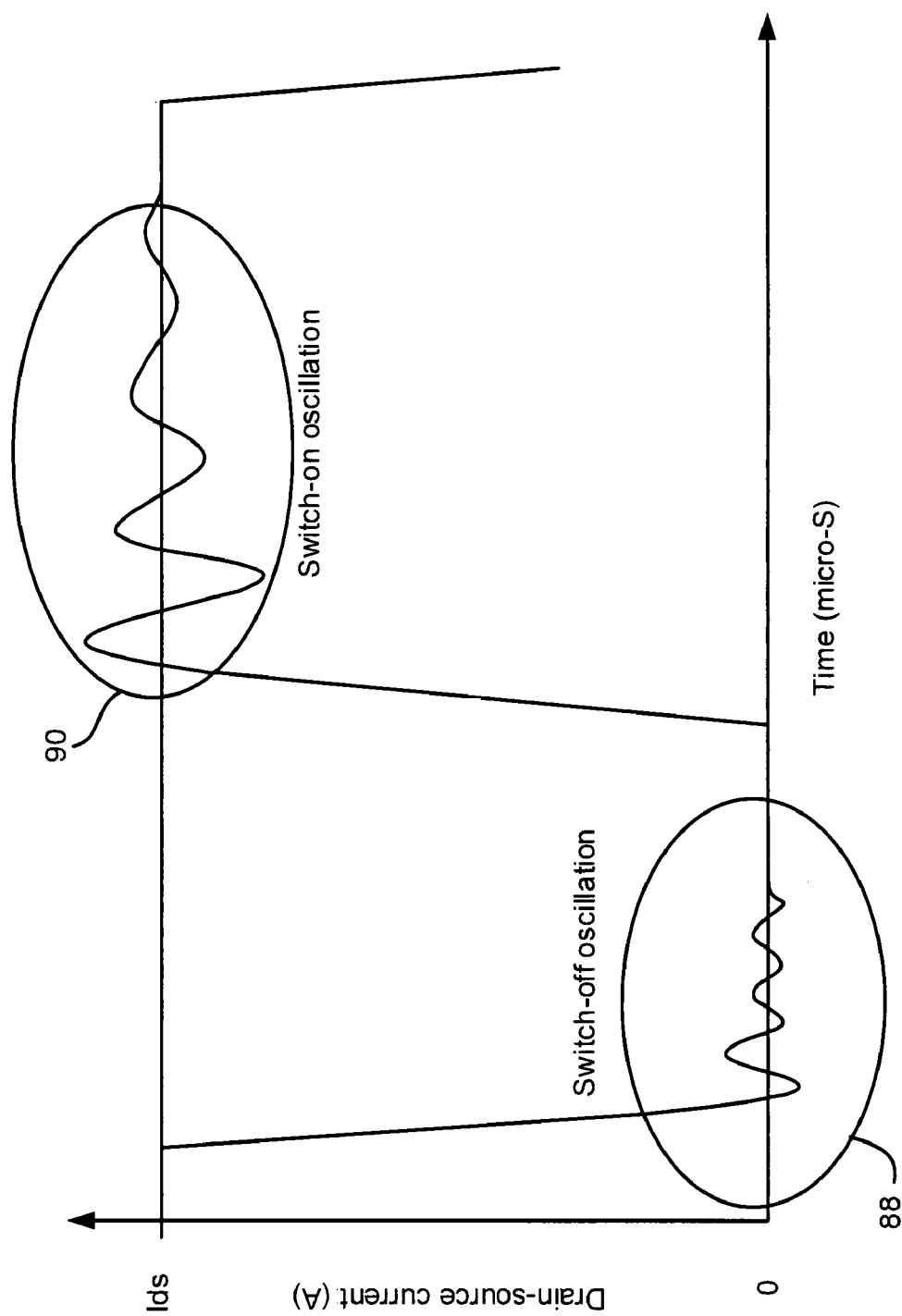
FIG. 8 shows a time-dependent profile of the current over the source-drain path of the power end stage of the pulse width-modulated motor control system over an entire switching cycle.

FIG. 5 now shows a fifth embodiment of the motor control system 1, with which an improvement in the signal quality of the voltage signal present at the input 40 of the microprocessor 5 is achieved. The arrangement described in FIG. 5 has many elements in common with that of FIG. 1, and to avoid unnecessary repetition of the description the same reference numbers have been used for common elements. Owing to unavoidable induction phenomena at the DC electric motor 10 during pulse width-modulated operation, the rectangular control voltage produced by the motor control system 1 at the electric motor 10 is always superimposed by a high-frequency oscillation component. By way of example, this response is shown in FIG. 8. FIG. 8 shows the profile for the current over the source-drain path of the field effect transistor 30 over one cycle of the pulse width-modulated control as a function of time. It is clearly shown that a decaying oscillation in the current over the source-drain path occurs both when the voltage at the DC electric motor 10 is off (switch-off oscillation 88) and when the voltage is on (switch-on oscillation 90). Although these high-frequency oscillations are attenuated owing to internal attenuating effects after a few oscillation periods, difficulties arise for highly precise measurement of the voltage drop across the source-drain path of the power field effect transistor 30.

The embodiment of FIG. 5 introduces smoothing modules 20 into the measuring line between the input 40 of the microprocessor 5 and the node point between the drain terminal of the power field effect transistor 30 and the anode of the freewheeling diode 32, which smoothing modules 20 are in the form of so-called "snubber" circuits. These connect the measuring line on one side to ground and on the other side to the high rail of the 12 volt vehicle power supply system 22. Each snubber circuit in this case comprises a nonreactive resistor (R2, R3) 72, 74, which is connected in series with a capacitor (C2, C3) 76, 78, respectively. Introducing the snubber circuits between the measuring line at the input 40 of the microprocessor 5 and ground or the high rail results in additional attenuation of the current or voltage oscillation over the source-drain path of the power field effect transistor 30. Given a suitable selection of the resistance-capacitance (RC) constant of each snubber circuit, excessive attenuation of the high-frequency current or voltage oscillations can be achieved. Given optimum matching, it is possible to realize the so-called asymptotic limit case, in which a zero crossing of the high-frequency current or voltage oscillation is completely suppressed and, nevertheless, a rapid drop to the asymptotic limit value occurs within approximately one oscillation period. At correspondingly matched RC constants for the snubber circuits, the time at which the microprocessor 5 determines the voltage drop across the source-drain path of the power field effect transistor 30 via the integrated analog-to-digital converter is then selected such that the asymptotic limit value has already substantially been set. In this case, a delay of a few microseconds in comparison with the rising or falling edges of the pulse width-modulated motor current is therefore set. By introducing the snubber circuits it is possible to markedly increase yet again the accuracy of the measurement of the voltage drop across the source-drain path of the power field effect transistor 30.

Figure 6:
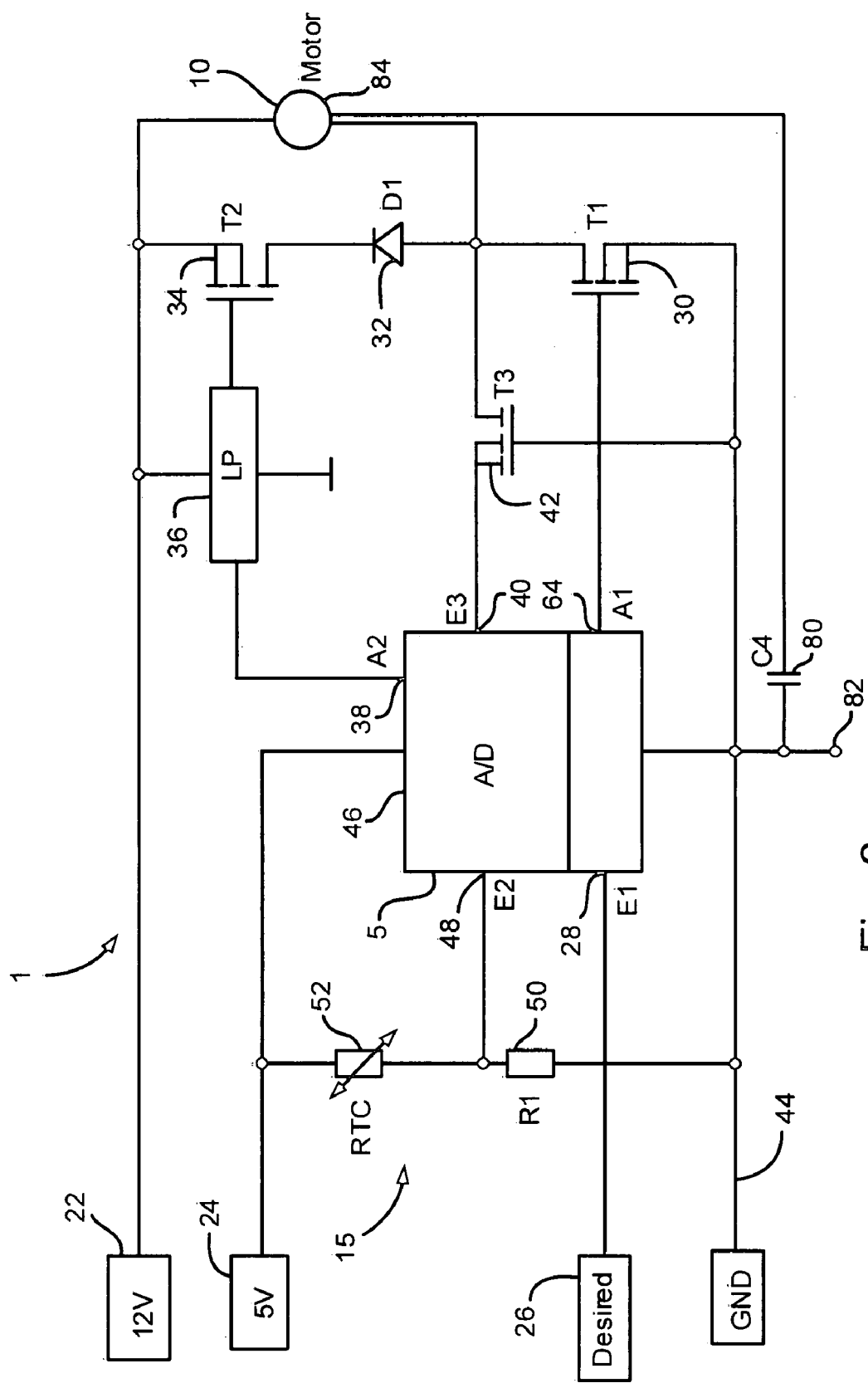
FIG. 6 shows a sixth embodiment of the circuit diagram of FIG. 1.

Finally, FIG. 6 shows a sixth embodiment of the motor control system 1, in which, by suitably introducing a capacitor (C4) 80, leakage currents in the motor control system 1 can be reduced again. In this development, the capacitor 80 is introduced between the housing 84 of the motor 10 and the ground of the motor control system 1. The arrangement described in FIG. 6 has many elements in common with that of FIG. 1, and to avoid unnecessary repetition of the description the same reference numbers have been used for common elements. A heat sink 82 of the microprocessor 5 is preferably used as a connection point between the capacitor 80 and the motor control system 1. The introduction of the capacitor 80 in the manner shown ensures that the housing 84 of the electric motor 10 and the base of the motor control system 1 are always at the same potential, as a result of which leakage currents can be further reduced on the one hand and the electromagnetic interference protection of the motor control system 1 is further improved on the other hand.

The features of the different embodiments of the motor control system 1 according to the invention presented here can each be used separately or in various combinations. In one overall embodiment, the motor control system elements according to the invention comprises all of the features shown in FIGS. 2 through 6.

Finally, reference is made to the fact that the exemplary embodiments shown only serve to illustrate the present invention and should not be understood as being restrictive.

A method of operation of the motor control system 1 according to FIG. 1 will now be discussed. The microprocessor 5 detects the voltage drop, present at its input 40, across the source-drain path of the power field effect transistor 30, via the integrated analog-to-digital converter, at a given time in the cycle of the pulse width-modulated motor control. Furthermore, the microprocessor 5 detects the temperature of the power field effect transistor 30 via the voltage divider formed from the temperature-variable resistor 52 and the nonreactive resistor 50. The microprocessor 5 is designed to determine the internal resistance of the power field effect transistor 30 from the detected voltage drop and the detected temperature on the basis of a reference table for the temperature-dependent resistance of the source-drain path of the power field effect transistor 30. The microprocessor 5 determines, in the following step, the current over the source-drain path of the power field effect transistor 30, which corresponds to the current at the driven DC electric motor 10, from the internal resistance of the power field effect transistor 30 and the detected voltage drop across the source-drain path of the power field effect transistor 30 using Ohm's Law. In the last method step, the microprocessor 5 compares the measured current at the DC electric motor 10 with a predetermined maximum value, which depends on the present duty cycle of the pulse width-modulated control and whose profile is illustrated schematically in FIG. 7. If the determined current at the DC electric motor 10 exceeds the maximum current given by the reference table for the maximum current at the given duty cycle, the microprocessor 5 introduces the shutdown of the power end stage of the pulse width-modulated motor control, for example by bringing the output 64 of the microprocessor 5 out of operation.

While certain embodiments of the present invention have been described in detail, those familiar with the art to which this invention relates will recognize various alternative designs and embodiments for practicing the invention as defined by the following claims.

What is claimed is:

1. A motor control system comprising:
  a monitoring circuit for monitoring a PWM control for a DC electric motor, the PWM control including at least a first field effect transistor that controls a current at the DC electric motor;
  the motor control system configured to detect a voltage drop across the first field effect transistor;
  a temperature sensor for detecting a temperature of the first field effect transistor; and
  a microprocessor for receiving a temperature-related signal from the temperature sensor relating to the temperature of the first field effect transistor, the microprocessor configured to determine an internal resistance of the first field effect transistor from the detected temperature thereof and determine a current at the DC electric motor from the internal resistance of the first field effect transistor and from the voltage drop across the first field effect transistor.

2. The motor control system of claim 1 wherein the microprocessor is configured to compare the current at the DC electric motor with a rated current value.

3. The motor control system of claim 2 wherein the rated current value is a function of a duty cycle of the PWM control.

4. The motor control system of claim 3 further comprising a reference table for storing rated current values.

5. The motor control system of claim 4 wherein the reference table is stored in a memory storage device.

6. The motor control system of claim 5 wherein the memory storage device is integrated in the microprocessor.

7. The motor control system of claim 2 including means for bringing the PWM control out of operation if the current at the DC electric motor exceeds the rated current value by a predetermined amount.

8. The motor control system of claim 1 further comprising a smoothing module configured to attenuate high-frequency oscillations of the voltage drop across the first field effect transistor prior to the voltage being further-processed.

9. The motor control system of claim 8 wherein the smoothing module comprises at least one resistor and a capacitor (C2, C3) connected in series.

10. The motor control system of claim 9 including at least a second smoothing module, wherein the smoothing module attenuates high-frequency oscillations which occur in the voltage drop across the first field effect transistor in an off state of the PWM control, and the second smoothing module attenuates high-frequency oscillations which occur in the voltage drop across the first field effect transistor in an on state of the PWM control.

11. A motor control system comprising:
  a monitoring circuit for monitoring a PWM control for a DC electric motor, the PWM control including at least a first field effect transistor that controls a current at the DC electric motor;
  the motor control system configured to detect a voltage drop across the first field effect transistor;

a temperature sensor for detecting the temperature of the first field effect transistor, means for determining the resistance of the first field effect transistor from the detected temperature thereof, and means for determining the current at the DC electric motor from the resistance of the first field effect transistor and from the voltage drop across the first field effect transistor;

a first smoothing module configured to attenuate high-frequency oscillations of the voltage drop across the first field effect transistor prior to the voltage being further-processed, the first smoothing module attenuating high-frequency oscillations which occur in the voltage drop across the first field effect transistor in an off state of the PWM control; and a second smoothing module for attenuating high-frequency oscillations which occur in the voltage drop across the first field effect transistor in an on state of the PWM control.

12. The motor control system of claim 11 wherein the smoothing module comprises at least one resistor and a capacitor connected in series.

13. The motor control system of claim 11 including means for comparing the current at the DC electric motor with a rated current value.

14. The motor control system of claim 13 wherein the rated current value is a function of a duty cycle of the PWM control.

15. The motor control system of claim 13 including means for bringing the PWM control out of operation if the current at the DC electric motor exceeds the rated current value by a predetermined amount.

16. A method for monitoring PWM control for a DC electric motor by means of a motor control system, the PWM control comprising at least one field effect transistor, which controls a current at the DC electric motor, the motor control system being configured to monitor the current at the DC electric motor, the method comprising the steps of:

(a) detecting a voltage drop across the field effect transistor;

(b) detecting a temperature of the field effect transistor;

(c) determining an internal resistance of the field effect transistor from the detected temperature; and (d) determining the current at the DC electric motor from the internal resistance of the field effect transistor and from the voltage drop across the field effect transistor.

17. The method of claim 16 wherein step (a) further comprises attenuating high-frequency oscillations of the voltage drop across the field effect transistor prior to the voltage drop being further-processed.

18. The method of claim 17 including (e) a first smoothing module attenuating high-frequency oscillations which occur in the voltage drop across the first field effect transistor in an off state of the PWM control.

19. The method of claim 18 including (f) a second smoothing module attenuating high-frequency oscillations which occur in the voltage drop across the first field effect transistor in an on state of the PWM control.

* * * * *